(12) United States Patent
Conroy

(10) Patent No.: US 6,514,097 B1
(45) Date of Patent: Feb. 4, 2003

(54) TEST AND BURN-IN SOCKET CLAMPING MECHANISM

(75) Inventor: Chad M. Conroy, Little Canada, MN (US)

(73) Assignee: Micro Control Company, Minneapolis, MN (US)

( * ) Notice: Subject to any disclaimer, the term of this patent is extended or adjusted under 35 U.S.C. 154(b) by 0 days.

(21) Appl. No.: 09/920,372

(22) Filed: Aug. 1, 2001

(51) Int. Cl.[7] ............................................. H01R 13/62
(52) U.S. Cl. ........................................ 439/330; 439/73
(58) Field of Search .......................... 439/73, 266, 330, 439/331

(56) References Cited

U.S. PATENT DOCUMENTS

| | | |
|---|---|---|
| 4,378,139 A | 3/1983 | Griffin et al. |
| 4,993,955 A | 2/1991 | Savant .......................... 439/73 |
| 5,249,972 A | 10/1993 | Walker ........................ 439/72 |
| 5,320,550 A | 6/1994 | Uratsuji et al. ............. 439/266 |
| 5,493,237 A | 2/1996 | Volz et al. ................... 324/754 |
| 5,697,795 A | 12/1997 | Abe .............................. 439/73 |
| 5,748,007 A | 5/1998 | Gaschke ..................... 324/755 |
| 6,086,387 A | 7/2000 | Gallagher et al. ............ 439/71 |

*Primary Examiner*—Khiem Nguyen
(74) *Attorney, Agent, or Firm*—Westman, Champlin & Kelly, P.A.

(57) ABSTRACT

A test and burn-in socket assembly designed to hold an integrated circuit module during testing or burn-in has a base that mounts a printed circuit connection board. The base has a central opening in which the integrated circuit module can be inserted. A pair of locking arms that will engage and clamp the integrated circuit module onto the printed circuit board are supported on a movable frame that is movable toward and away from the base. The arms are moved between clamping and release positions as the movable frame is moved. The movable frame is actuate by cams that are simultaneously moved by a handle or bail. The clamping arms are controlled so that they will move perpendicular to the integrated circuit when they are close to the board and move laterally to provide a space for installing and removing a board from its installed position. The board that has been tested to be removed and a new board to be inserted.

16 Claims, 2 Drawing Sheets

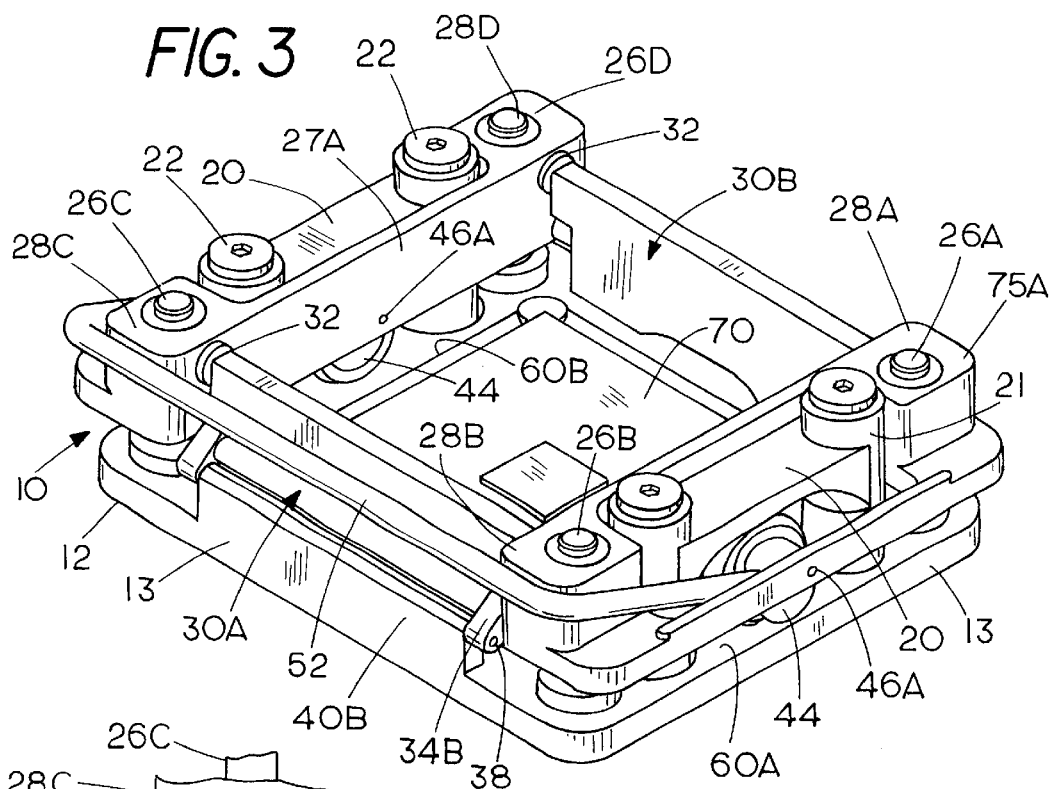
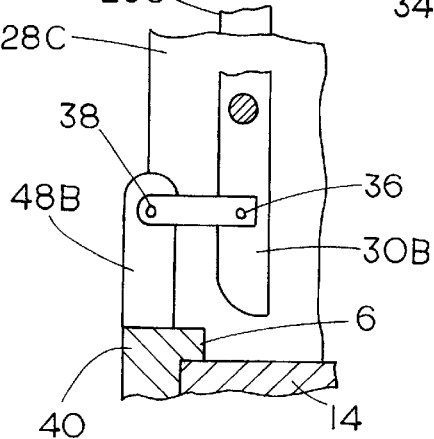
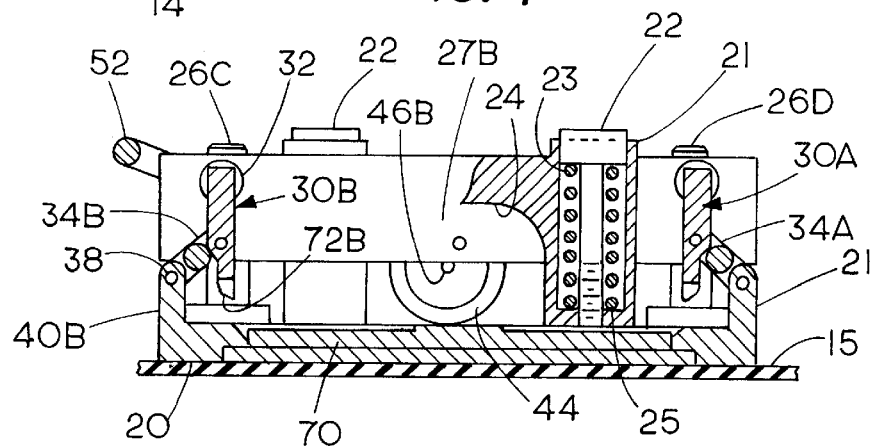

TEST AND BURN-IN SOCKET CLAMPING MECHANISM

BACKGROUND OF THE INVENTION

The present invention relates to a socket which is used for testing and burn-in of integrated circuits, and which has clamping members for clamping an integrated circuit to a contact set on a printed circuit board used in the test or burn-in function. The socket is reusable, and can quickly be opened or closed to clamp an integrated circuit (IC) in position.

A type of universal test and burn-in socket frame shown in U.S. Pat. No. 5,748,007, includes a clamp for an IC module. Thus, various sockets are known in the art for testing or burn-in testing and burn-in of IC modules, but many of these have some difficulty in loading and clamping, as well as being quite complex in operation and for manufacturing.

Existing sockets or frames are designed to hold integrated circuit products, but they generally are designed to accept only modules of one type.

SUMMARY OF THE INVENTION

The present invention relates to a socket or frame that is coupled to a printed circuit board for testing or burn-in to be coupled to an integrated circuit frame and provides a support for the integrated circuit. A clamping mechanism is utilized for holding a test device such as an integrated circuit, in intimate contact with test or burn-in contacts on the printed circuit board. The test or burn-in contacts provide a coupling for signals to and from the integrated circuit either for testing or burn-in.

The present device comprises a frame forming an open center, which provides access to the contacts on a printed circuit board carried by the frame, and has clamp plates of arms along two opposite sides that extend substantially the entire width of the frame. The clamp arms are actuated by wire levers or bails that move cams to raise and lower or move the clamp arms to release edges of an integrated circuit and laterally to provide a space into which an integrated circuit is inserted to contact the printed circuit board. When the levers are operated in an opposite direction the cams clamp overlie edges of the integrated circuit, and then move the clamp arms toward the printed circuit board to provide a pressure to clamp the integrated circuit against the contacts on the printed circuit board used in the test system. The levers actuate links connected to the clamp arms. The links provide the movement to raise and lower the arms from the clamping position substantially perpendicular to the integrated circuit plane when the arms are moved to force the integrated circuit toward the printed circuit board or when the clamp arms first move away from a clamp integrated circuits. Then the arms move laterally to provide clearance for removal of the integrated circuit in the frame or socket and replacing another integrated circuit in position.

The test and burn-in socket of the present invention is easily operated, and relatively low-cost, but yet provides for very positive clamping of the integrated circuit against the printed circuit board used as a contact set or test connector.

BRIEF DESCRIPTION OF THE DRAWINGS

FIG. 3 is a sectional view similar to FIG. 1 with a clamp in a released position;

FIG. 4 is a sectional view taken as on line 4—4 in FIG. 3; and

FIG. 5 is an enlarged view of an end portion of one of the clamp arms illustrating the control link used for showing the pivoting of the clamp arms.

DETAILED DESCRIPTION OF THE PREFERRED EMBODIMENTS

Figure 1:
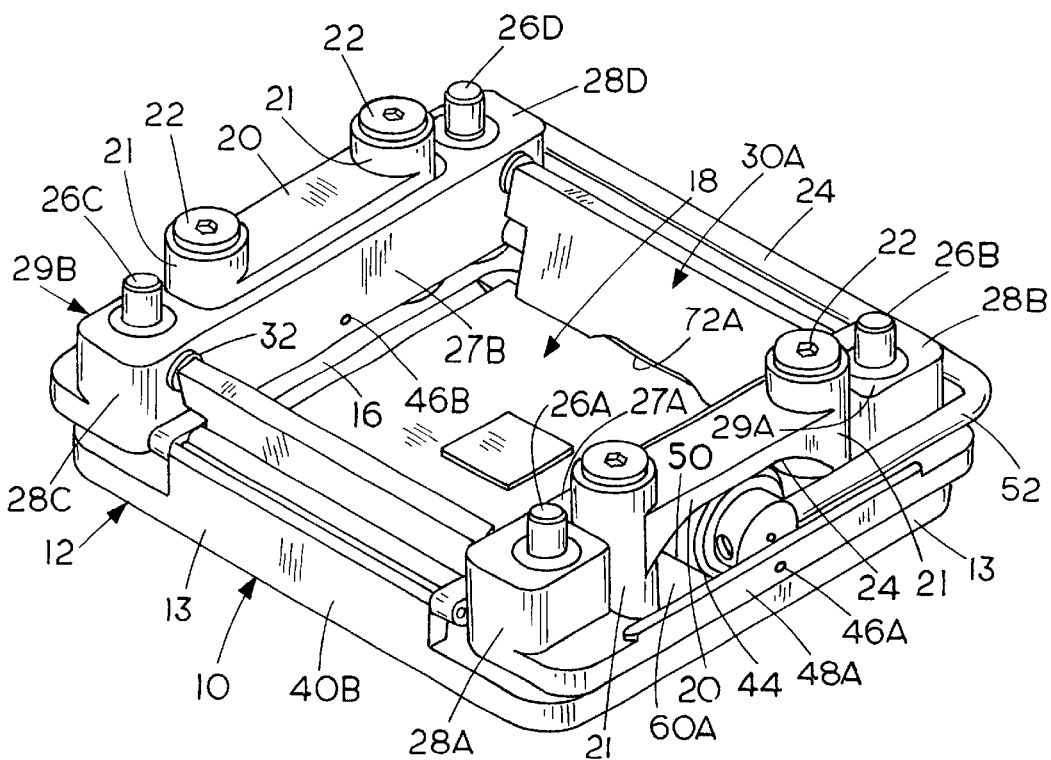
FIG. 1 is a perspective view of a test and burn-in socket made according to the present invention.
Figure 2:
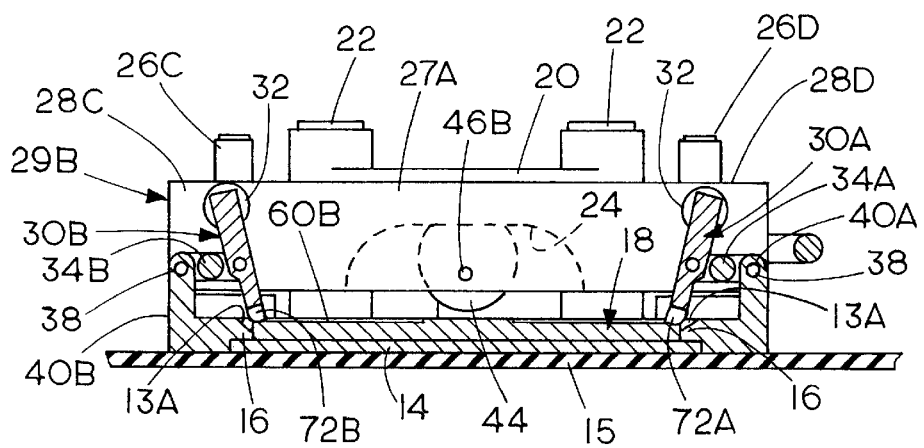
FIG. 2 is a sectional view taken as on line 2—2 in FIG. 1.

In FIG. 1, a test and burn-in socket, made according to the present invention, is illustrated at 10, and comprises a frame base 12 that has perimeter frame members 13 formed into a rectangular shape with an open center. A contact set or interconnect insert 14 is mounted on a printed circuit board 15 or other flat panel is adapted to be mounted in the center on overhanging perimeter flanges 16 that forms shoulders against which the printed circuit board is mounted. Flanges define the central opening in the base 12.

The central opening is of size to receive an integrated circuit chip or board 18, or other flat panel that is to be locked in place. The shoulders formed by the flanges 16 position the circuit board above the plate of the upper surface of the framed members 13 that the printed circuit board 14 is substantially flush with the plane of the top of the frame members. The frame members can be chamfered or beveled along side edges, as shown at 13A to provide clearance for clamp members, as will be explained.

A separate cam reaction member 20 is mounted with cap screws 22 on each of the opposite sides of the base. The reaction members 20, as shown, does form a cam follower or cam reaction bridge having an overhead caming wall with a cam follower surface 24 on the lower side of the bridge wall. The bridge 20 on each side of the base is supported by tubular end pillars 21 that are slideably mounted on the cap screws 22. The cap screws 22 are fastened to the base frame members 13 and the pillars 21 and bridge 20 are spring loaded toward the base, as shown schematically in FIG. 4. A spring 23 is placed between the underside cap screw heads and a retainer flange 25 at the bottom of each pillar 21. The pillar 21 and the bridge 20 thus are urged toward the base by the spring force.

Additionally, the base 12 supports four upright guide posts or smooth studs 26A, 26B, 26C, and 26D, at the four corners of the base.

There are sliding clamp blocks 28A, 28B, 28C, and 28D, mounted on the guide posts 26A–26D. Blocks or members 28A–28D extend from the guide posts 26A–26D out there inwardly toward the central opening of the base. The members or blocks 28A and 28B are joined with a flange wall 27A, and the blocks 28C and 28D are joined with a flange wall 27B. Also extend outwardly toward the outer edges of the frame, an have side rails 48A and 48B that join blocks 28A and 28B on one of the moveable frame members, and a side rail 48B that joins the blocks 28C and 28D on the other one of the movable frames.

A pair of clamping arms 30A and 30B are pivotally mounted with pivot pins 32 between opposite ends of the sliding frames 29A and 29B. Clamping arms 30A and 30B are thus on opposite sides of the base 12, and move up and down with the sliding frames 29A and 29B when they are moved. Sliding frames 29A and 29B are along the sides of the base perpendicular to the clamping arms 30A and 30B.

The pivot pins indicated at 32 are retained in the members 28A–28D of the frame 29A and 29B, and the angle of the arms 30A and 30B about the pivot pin axes is controlled by links. As shown, a pair of links 34A control the arms 30A and links 34B control the arms 30B. The first ends of the links are pivotally mounted as at 36 (See FIG. 5), to the side edges of the arms 30A and 30B, and the opposite ends of the links 34 and 34B are each pivotally mounted on pivots 38 to a respective center upright flange of column 40A and 40B on opposite sides of the frame 12.

The pivot pins 38 and 36 on the links 34A and 34B are spaced such that the arms 30A and 30B will be forced to move about their pivot pins 32 when the sliding frames 29A and 29B and in particular the sliding end blocks 28A and 28B, 28C and 28D of the sliding frame members are raised and lowered.

The bridge supports 20 on each side of the frame 12 and the cam follower track or surface 24 are engaged with rotatable cams 44. The cams are rotatably mounted wall suitable pins 46A, 46B on the side walls 27A and 27B and the rails 48A and 48B the side walls and rails are, as stated, in turn, fixed onto the sliding end blocks 28A–28D forming part of the sliding frames 29A and 29B.

The cams 44 have cam surfaces 50 that ride against the cam follower surfaces 24. The rotation of the cams 44 is controlled with a U-shaped handle or bail 52 that is connected by passing ends of the handle 52 through openings in end portions of both of the cams 44, as can be seen in FIGS. 1 and 3.

When the handle or bail 52 is in the position shown in FIG. 1, the cams 44 bear or react forces against the surfaces 24 and push the sliding frames 29A and 29B downwardly through the pins 46A and 46B acting on the walls 27A and 27B and side rails 48A and 48B of the sliding frames. The bridge members 20 are spring loaded toward the base 12 with springs 23, as described, to provide the controlled reaction force on the frames 29A and 29B. When the bail 52 is moved to the position shown in FIG. 3, the cams act against the surfaces 60A and 60B of the side frame members and force the sliding frames 29A and 29B upwardly to near the top of the posts 26A–26D (see FIG. 3). This will cause the arms 30A and 30B to be moved first substantially vertically to release the integrated circuit that is being held in the socket or frame, and then move laterally as the links 34A and 34B pivot, because of the arc of movement of the links. The clamp arms 30A and 30B become substantially vertical and provide enough clearance for removal of an integrated circuit such as that shown at 70, and replacement with a new circuit.

The printed circuit board 14 remains on the base 12, and as can be seen in FIG. 3, the frame opening that is defined at 17 will receive another one of the integrated circuits 70.

The force with which the integrated circuit is clamped in place is regulated by the springs 23, and also the geometry of the mounting pivot points and lengths of the links controlling the arms 30A and 30B. It can be seen that the arms 30A and 30B are recessed at their lower edges as indicated at 72A and 72B, to engage the integrated circuit being held in place only at selected locations.

The pivoting links 34A and 34B provide for control of the arms 30A and 30B to permit locking the integrated circuit 70 into place and releasing and providing clearance easily.

Although the present invention has been described with reference to preferred embodiments, workers skilled in the art will recognize that changes may be made in form and detail without departing from the spirit and scope of the invention.

What is claimed is:

1. A socket assembly for holding an integrated circuit during testing or burn-in comprising:
    a base, said base having peripheral walls defining a central opening of the shape of a circuit panel to be held against provided contacts held relative to the base;
    guide posts mounted on the base and providing guides extending generally perpendicular to the base; and
    a movable frame slideably mounted on said guide posts; and
    a cam actuator carried on the movable frame and reacting against surfaces carried by the base, said cam actuator being movable to move the guide frame toward and away from the provided contacts upon selective movement of the cam actuator, the cam actuator comprising locking arms for seating a circuit panel in the frame overlying the provided contacts.

2. The socket assembly of claim 1 wherein the cam actuator locking arms comprise a pair of arm members, one on each of opposite sides of the frame, said arm members being pivotally mounted onto the movable frame, and a separate guide link for each arm member having a first end pivotally mounted on a respective arm member and a second end pivotally mounted on the base, such that as the movable frame moves up and down, the arm members are caused to pivot relative to the movable frame.

3. The socket assembly of claim 2 wherein the links being positioned so that in a clamping position wherein the arms engage and clamp a circuit panel against the contacts, portions of the arms overlie such integrated circuit, and upon movement of the sliding frame away from the base, the arms move substantially vertically to disengage the integrated circuit, and then move laterally outwardly to position where they no longer overlie the central opening for the circuit panel.

4. The socket assembly of claim 3 wherein said cam actuator comprises a pair of cams on sides of the base perpendicular to the side on which the arm members are positioned, and a handle for simultaneously moving the cams about pivot axes.

5. The socket assembly of claim 1 wherein the cam actuator comprise a pair of cams mounted to the movable frame on opposite sides of the base about a common axis, and cam reaction members carried on the base and overlying the cams, respectively, the cams also engaging surfaces of the base so that as the cams are rotated, the movable frame is moved selectively toward and away from the base.

6. The socket assembly of claim 5 wherein the cam reaction members comprise bridges supported on the base at opposite ends and having walls overlying the respective cam.

7. The socket assembly of claim 1 wherein the circuit panel comprises an integrated circuit.

8. The socket assembly of claim 6 wherein there are springs acting against the bridges to spring load the bridges toward the base.

9. The socket assembly of claim 1 wherein the base peripheral walls have recesses on inner edges thereof defining the central opening, said recesses receiving a contact set carrying the contacts, and the contact set having a surface positioned at a level so that a circuit panel held in the socket assembly and contacting the contact set has an upper surface substantially coplanar with an upper surface of the peripheral walls.

10. The socket assembly of claim 2 wherein said peripheral walls of the base define a generally rectangular opening, and said locking arms extend substantially along the entire distance of two opposite sides of the rectangular opening.

11. The socket assembly of claim 10 wherein said locking arms have edges that overlie the circuit panel in a locking position, and the edges are recessed such that there is a controlled line of contact with a circuit panel by each of the arms.

12. The socket assembly of claim 3 wherein the links controlling movement of the locking arms are substantially parallel to a plane defined by the circuit panel when the arms are in a locking position, and move in an arc when the arms are moved away from the locking position such that the links cause greater lateral movement as the distance between the edges of the arms adjacent a circuit panel increases.

13. A socket assembly for holding an integrated circuit during testing or burn-in comprising:

a base, said base having peripheral walls defining a central opening that is generally rectangular in shape and of a size to permit an integrated circuit to be held to be received adjacent edges of the opening;

the peripheral walls having a support for a printed circuit to underlie the central opening secured to the peripheral walls;

a pair of movable frames along two sides of said central opening, said frame as being movable toward and away from the peripheral walls defining the base;

a pair of locking arms on the sides of the base generally perpendicular to the movable frames, and pivotally mounted on said moveable frames and a location generally in registry with the edges of the central opening;

a separate control link pivotally mounted at first ends to one of the arms, respectively, and pivotally mounted at second ends thereof to a support on the base; and an actuator for moving the movable frames toward and away from the base to thereby cause the links to pivot the arms to a clamping position with edges of the arms overlying the central opening, and to a loading position where the edges of the arms clear of the central opening.

14. The socket assembly of claim 13, wherein said actuator comprises a cam actuator rotatably mounted on the moveable frame and engaging surfaces supported with respect to the base to provide reaction forces moving the moveable frames selectively toward and away from the base.

15. The socket assembly of claim 14 and a handle mounted on the cam actuators for manually rotating the cam actuators.

16. The socket assembly of claim 14 wherein the surface engaged by the cam is on a bridge member, and a pair of springs supported relative to the base and spring loading the bridge member toward the base.

\* \* \* \* \*